United States Patent
Masaki et al.

(10) Patent No.: US 9,890,470 B2
(45) Date of Patent: Feb. 13, 2018

(54) SEED CRYSTAL HOLDER FOR GROWING A CRYSTAL BY A SOLUTION METHOD

(71) Applicant: KYOCERA Corporation, Fushimi-ku, Kyoto-shi, Kyoto (JP)

(72) Inventors: Katsuaki Masaki, Kyoto (JP); Yutaka Kuba, Kyoto (JP); Chiaki Domoto, Kyoto (JP); Daisuke Ueyama, Kyoto (JP); Yuichiro Hayashi, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 233 days.

(21) Appl. No.: 14/375,783

(22) PCT Filed: Jan. 30, 2013

(86) PCT No.: PCT/JP2013/052091
§ 371 (c)(1),
(2) Date: Jul. 30, 2014

(87) PCT Pub. No.: WO2013/115272
PCT Pub. Date: Aug. 8, 2013

(65) Prior Publication Data
US 2015/0020730 A1    Jan. 22, 2015

(30) Foreign Application Priority Data

Jan. 30, 2012 (JP) .................................. 2012-016382

(51) Int. Cl.
*C30B 15/32* (2006.01)
*C30B 9/06* (2006.01)
*C30B 29/36* (2006.01)

(52) U.S. Cl.
CPC ............. *C30B 9/06* (2013.01); *C30B 15/32* (2013.01); *C30B 29/36* (2013.01); *Y10T 117/1024* (2015.01); *Y10T 117/1092* (2015.01)

(58) Field of Classification Search
CPC .... C30B 9/00; C30B 9/04; C30B 9/06; C30B 15/00; C30B 15/30; C30B 15/32;
(Continued)

(56) References Cited

U.S. PATENT DOCUMENTS

| 5,746,827 A | * | 5/1998 | Barrett et al. ........... C30B 23/00 117/100 |
| 2006/0254507 A1 | * | 11/2006 | Otsuki .................... C30B 29/36 117/109 |

(Continued)

FOREIGN PATENT DOCUMENTS

| JP | 2000-264790 A | 9/2000 |
| JP | 2000-264794 A | 9/2000 |

(Continued)

OTHER PUBLICATIONS

Colombo, et al. publication entitled "Joining SiC-based ceramics with preceramic polymers," ResearchGate Article published online at https://www.researchgate.net/publication/27271558 in Jan. 2002.*

(Continued)

*Primary Examiner* — Kenneth A Bratland, Jr.
(74) *Attorney, Agent, or Firm* — Procopio Cory Hargreaves and Savitch LLP

(57) ABSTRACT

A seed crystal holder according to the present invention for growing a crystal by a solution method, and that includes a seed crystal made of silicon carbide; a holding member above the seed crystal; a bonding agent configured to fix the seed crystal and the holding member; and a sheet member made of carbon which is interposed in the bonding agent in a thickness direction, and which has an outer periphery smaller than an outer periphery of the seed crystal in a plan view.

11 Claims, 9 Drawing Sheets

(58) Field of Classification Search
CPC ......... C30B 19/00; C30B 19/02; C30B 19/06; C30B 19/062; C30B 19/068; C30B 29/00; C30B 29/10; C30B 29/36; Y10T 117/00; Y10T 117/10; Y10T 117/1024; Y10T 117/1032
USPC ..... 117/11, 13, 35, 54, 73, 78–79, 200, 206, 117/208, 911, 937, 951
See application file for complete search history.

(56) References Cited

U.S. PATENT DOCUMENTS

| | | | |
|---|---|---|---|
| 2011/0254017 A1 | 10/2011 | Nishiguchi et al. | |
| 2012/0103251 A1* | 5/2012 | Sakamoto ................ | C30B 9/00 117/208 |

FOREIGN PATENT DOCUMENTS

| | | | |
|---|---|---|---|
| JP | 2008-44802 A | | 2/2008 |
| JP | 2008-105896 | * | 5/2008 |
| JP | 2008-105896 A | | 5/2008 |
| JP | 2011-219337 A | | 11/2011 |
| WO | 2011/010394 A1 | | 1/2011 |
| WO | WO 2011/010394 | * | 1/2011 |
| WO | WO 2011/010394 A1 | * | 1/2011 |

OTHER PUBLICATIONS

International Search reported dated Feb. 26, 2013 issued in counterpart International application No. PCT/JP2013/052091.

* cited by examiner (a)

(b)

SEED CRYSTAL HOLDER FOR GROWING A CRYSTAL BY A SOLUTION METHOD

TECHNICAL FIELD

The present invention relates to a seed crystal holder in which a seed crystal is joined to a holding member, a crystal growing device using the seed crystal holder, and a crystal growing method of growing a crystal by using the seed crystal holder.

BACKGROUND ART

As a crystal which currently attracts attention, there is silicon carbide (SiC) which is a compound of carbon and silicon. The silicon carbide has an advantage of, for example, a good voltage endurance characteristic, or the like. In a method of growing the silicon carbide crystal, there are, for example, a sublimation method, a solution method, and the like. The method of growing the silicon carbide crystal by the solution method is disclosed, for example, in Japanese Unexamined Patent Application Publication No. 2000-264790.

SUMMARY OF INVENTION

In research and development for growing a crystal made of silicon carbide, it is difficult to fix a seed crystal and a crystal grown on a lower surface of the seed crystal to a holding member. An object of the present invention is suggested in view of the circumstances described above, and is suggested to provide a seed crystal holder that can stably fix the seed crystal to the holding member, and a crystal growing device and a crystal growing method using the seed crystal holder.

A seed crystal holder according to the present invention is used for growing a crystal by a solution method, and includes a seed crystal made of silicon carbide; a holding member above the seed crystal; a bonding agent fixing the seed crystal and the holding member; and a sheet member made of carbon which is interposed in the bonding agent in a thickness direction, and which has an outer periphery smaller than an outer periphery of the seed crystal in a plan view.

A crystal growing device according to the present invention includes a melting crucible that keeps a solution for growing a crystal; and the seed crystal holder described above.

A crystal growing method according to the present invention includes a first preparation step of preparing a melting crucible and a solution of silicon including carbon which is kept in the melting crucible; a second preparation step of preparing the seed crystal holder described above; and a growing step of bringing a lower surface of the seed crystal in contact with the solution kept in the melting crucible, raising a holding member upwardly, and growing a silicon carbide crystal from the solution on the lower surface of the seed crystal.

In the seed crystal holder according to the present invention, since the sheet member is interposed in the bonding agent, it is possible to alleviate stress inherent in the bonding agent. Therefore, the bonding agent is not easily peeled off from the seed crystal or the holding member.

Further, in the crystal growing device according to the present invention, since the seed crystal holder described above is used, it is possible to cause the seed crystal not to be easily peeled off from the bonding agent. Therefore, the seed crystal is not easily dropped while the crystal is grown, so that the crystal on the lower surface of the seed crystal can grow for a long time. As a result, it is possible to cause the crystal to be grown on the lower surface of the seed crystal to be large.

In addition, in the crystal growing method according to the present invention, it is possible to cause the seed crystal not to be easily peeled off from the bonding agent by using the seed crystal holder described above. Therefore, it is possible to grow the crystal on the lower surface of the seed crystal to be long (large) in the thickness direction.

BRIEF DESCRIPTION OF DRAWINGS

FIG. 2(a) is a cross-sectional view in which a part of the seed crystal holder is enlarged, and FIG. 2(b) is a plan view illustrating the seed crystal holder viewed from above in a see-through manner.

FIG. 5(a) is a cross-sectional view in which a part of the seed crystal holder is enlarged, and FIG. 5(b) is a plan view illustrating the seed crystal holder viewed from above in a see-through manner.

DESCRIPTION OF EMBODIMENTS

Figure 1:
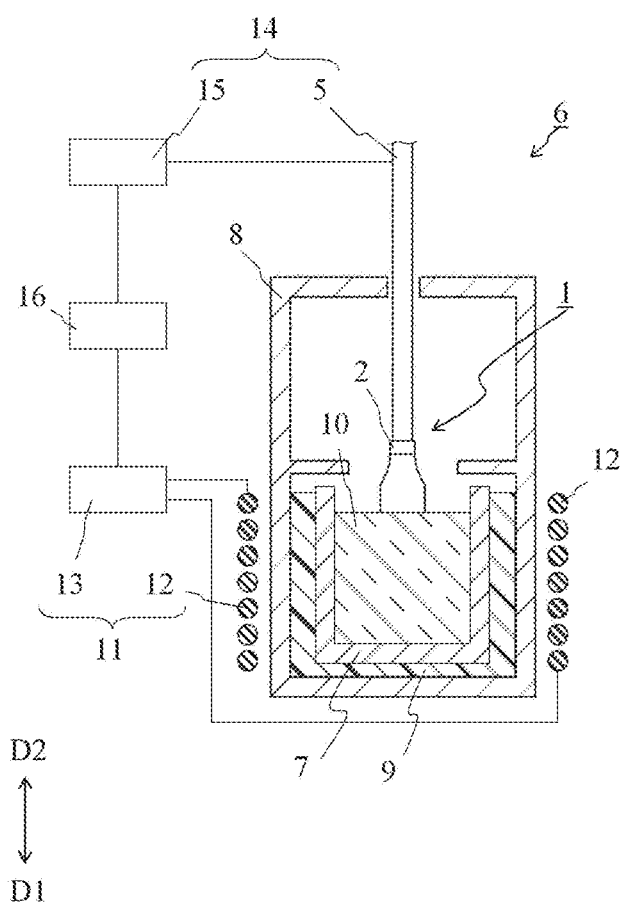
FIG. 1 is a cross-sectional view illustrating an exemplary embodiment of a crystal growing device according to an embodiment of the present invention.

Embodiments of a seed crystal holder, a crystal growing device, and a crystal growing method according to the present invention are described with reference to the drawings. A seed crystal holder 1 includes a seed crystal 2, a sheet member 3, a bonding agent 4, and a holding member 5. The seed crystal holder 1 is used in a crystal growing device 6 as illustrated in FIG. 1. First, the crystal growing device 6 is described.

<Crystal Growing Device>

A melting crucible 7 is disposed in a melting crucible container 8. The melting crucible container 8 keeps the melting crucible 7. A lagging material 9 is disposed between the melting crucible container 8 and the melting crucible 7. The lagging material 9 encloses the circumference of the melting crucible 7. The lagging material 9 suppresses the heat radiation from the melting crucible 7, and contributes the temperature of the melting crucible 7 to be stably maintained.

The melting crucible 7 functions as a container that causes raw materials of silicon carbide single crystal to be grown to be melted inside. According to the present embodiment, in the melting crucible 7, melted silicon is used as a solvent, and carbon is dissolved in the solvent to be accumulated as a solution 10. According to the present embodiment, a solution method is used, and a crystal is grown by causing the inside of the melting crucible 7 to be close to the thermal equilibrium.

The melting crucible 7 is heated by a heating mechanism 11. The heating mechanism 11 according to the present embodiment uses an induction heating scheme of heating the melting crucible 7 by electromagnetic induction. The heating mechanism 11 includes coils 12 and an AC power supply 13. The melting crucible 7 is configured with a material having, for example, carbon (graphite) as a main component.

The solution 10 is kept in the melting crucible 7. The solution 10 is obtained by dissolving carbon that configures the silicon carbide crystal to be grown on a lower surface 2B of the seed crystal 2 in the solution of silicon that configures silicon carbide crystal as well. The solubility of an element to be a solute increases as the temperature of the element to be a solvent becomes high. Therefore, the temperature of the solution 10 that causes many solutes to be dissolved in the solvent under the high temperature decreases near the seed crystal 2 by decreasing the temperature of the lower surface 2B of the seed crystal 2 to be slightly lower than the temperature of the solution 10, and the solutes are precipitated on the basis of the thermal equilibrium. The silicon carbide crystal can be grown on the lower surface 2B of the seed crystal 2 by using the precipitation due to the thermal equilibrium.

The coils 12 are formed with conductors, and are wound to enclose the circumference of the melting crucible 7. The AC power supply 13 causes alternating currents to flow to the coils 12. The heating time of a set temperature can be adjusted by adjusting the amount of the alternating currents that flow to the coils 12.

According to the present embodiment, the melting crucible 7 is heated by the induction heating scheme. Further, the solution 10 may generate heat by causing the induced current to flow to the solution 10 itself by the electromagnetic field. When heat is generated in the solution 10 itself in this manner, the melting crucible 7 itself may not be caused to generate heat.

The seed crystal 2 is brought into contact with the solution 10 by a conveyance mechanism 14. The conveyance mechanism 14 also can transfer out the crystal grown on the lower surface 2B of the seed crystal 2. The conveyance mechanism 14 includes the holding member 5 and a power source 15. The seed crystal 2 and the crystal grown on the lower surface 2B of the seed crystal 2 are transferred in and out through the holding member 5. The seed crystal 2 is provided on a lower end surface 5A of the holding member 5, and movement of the holding member 5 is controlled by the power source 15 in upper and lower directions (directions D1 and D2). According to the present embodiment, the direction D1 means the lower direction in the physical space, and the direction D2 means the upper direction in the physical space.

In the crystal growing device 6, the AC power supply 13 of the heating mechanism 11 and the power source 15 of the conveyance mechanism 14 are connected to a control unit 16 to be controlled. That is, the crystal growing device 6 is controlled by interlocking the heating and the temperature control of the solution 10 and the transfer of the seed crystal 2, by the control unit 16. The control unit 16 includes a central processing unit and a storage unit such as a memory, and is configured with, for example, a well-known computer.

The holding member 5 of the seed crystal holder 1 is provided in the conveyance mechanism 14 of the crystal growing device 6 according to the present embodiment, as described below. Then, the lower surface 2B of the seed crystal 2 which is fixed on the lower end surface 5A of the holding member 5 is brought into contact with the solution 10, so that the crystal can be grown on the lower surface 2B.

The crystal growing device 6 according to the present embodiment grows the crystal by providing the seed crystal holder 1 in the conveyance mechanism 14 to be described below. The seed crystal holder 1 causes the bonding agent 4 not to be easily peeled off from the seed crystal 2 or the holding member 4. Therefore, it is possible to cause the seed crystal 2 not to be easily dropped while the crystal is grown, so that the crystal on the lower surface 2B of the seed crystal 2 can stably grow for a long time. Therefore, the crystal growing device 6 can cause the crystal to be grown on the lower surface 2B of the seed crystal 2 to be large in the thickness direction.

<Seed Crystal Holder>

Next, the seed crystal holder 1 according to the present embodiment of the present invention is described in detail as follows. The seed crystal holder 1 according to the present embodiment is the seed crystal holder 1 used for growing a crystal by the solution method, and includes the seed crystal 2 made of silicon carbide, the holding member 5 on the seed crystal 2, the bonding agent 4 that fixes the seed crystal 2 and the holding member 5, and the sheet member 3 made of carbon which is interposed in the bonding agent 4 in the thickness direction and has an outer periphery smaller than the outer periphery of the seed crystal 2 in the plan view.

The seed crystal 2 is configured with the silicon carbide crystal. The silicon carbide crystal of the seed crystal 2 can use, for example, the silicon carbide single crystal. The thickness of the seed crystal 2 can be set to be, for example, from 0.1 mm to 10 mm. The seed crystal 2 can be provided so that the external form in the plan view has, for example, a polygonal shape or a circular shape. The horizontal width dimension of the seed crystal 2 can be set to be, for example, from 5 mm to 20 cm.

Figure 2:
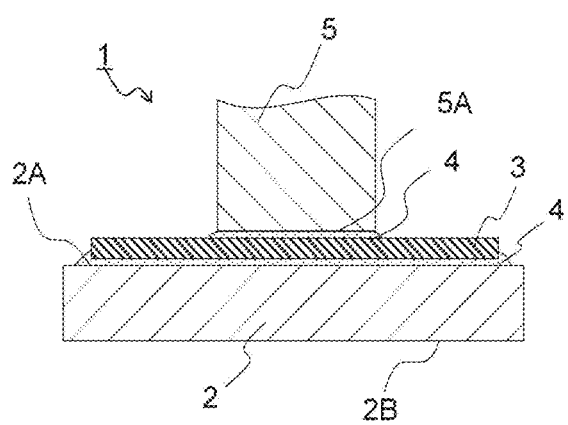
FIG. 2 is a diagram illustrating a seed crystal holder according to the embodiment of the present invention.

The lower end surface 5A of the holding member 5 is fixed to an upper surface 2A of the seed crystal 2 through the bonding agent 4, as illustrated in FIG. 2(a). That is, the holding member 5 is positioned above the seed crystal 2 with the bonding agent 4 interposed therebetween. Here, FIG. 2(a) is a cross-sectional view illustrating an enlarged part of the seed crystal holder 1 including the seed crystal 2, the bonding agent 4, and the holding member 5.

The holding member 5 may include the lower end surface 5A. The lower end surface 5A has a plan view of, for example, a polygonal shape such as a square, or a circular shape. The holding member 5 has a cubic shape of, for example, a polygonal column shape, a rod shape such as a cylindrical shape, or a rectangular parallelepiped shape.

It is possible to appropriately select a material for the holding member 5, and the holding member 5 may be configured with a material including, for example, an oxide represented by zirconium oxide or magnesium oxide, or carbon, as a main component. The holding member 5 can use, for example, a polycrystalline substance of carbon, or a burned substance obtained by firing carbon. If the holding member 5 is configured with the polycrystalline substance or the sintered substance of carbon, it is possible to increase the porosity in the holding member 5. When the porosity of the holding member 5 is increased, it is possible to release gas generated in the bonding agent 4 from the holding member 5, and to maintain the bonding strength with the bonding agent 4 by suppressing bubbles or the like generated in the bonding agent 4.

The area of the lower end surface 5A of the holding member 5 may be greater than that of the upper surface 2A of the seed crystal 2, may be identical to that of the upper surface 2A of the seed crystal 2 in size, and may be smaller than that of the upper surface 2A of the seed crystal 2. According to the present embodiment, the area of the lower end surface 5A of the holding member 5 is smaller than that of the upper surface 2A of the seed crystal 2. Further, when the area of the lower end surface 5A of the holding member 5 is equal to or greater than that of the upper surface 2A of the seed crystal 2, it is possible to cause the heat of the seed crystal 2 to be easily radiated from the holding member 5 throughout the entire upper surface 2A of the seed crystal 2.

The bonding agent 4 fixes the seed crystal 2 and the holding member 5. The bonding agent 4 is disposed to be interposed between the upper surface 2A of the seed crystal 2 and the lower end surface 5A of the holding member 5. A material for the bonding agent 4 can be appropriately set according to the material of the seed crystal 2 and the material of the holding member 5. It is possible to use, for example, a ceramic bonding agent including aluminum oxide, magnesium oxide, zirconium oxide, or the like or a carbon bonding agent made from carbon, as the bonding agent 4.

The bonding agents 4 interpose the sheet member 3 in the thickness direction. Here, in the description below, among the bonding agent 4, a part between the sheet member 3 and the holding member 5 may be called the bonding agent 4a, and a part between the sheet member 3 and the seed crystal 2 may be called the bonding agent 4b, in particular. The sheet member 3 may be fixed to the lower end surface 5A of the holding member 5 through the bonding agent 4a, and also may be fixed to the upper surface 2A of the seed crystal 2 through the bonding agent 4b.

The sheet member 3 has an outer periphery smaller than that of the seed crystal 2 in the plan view. The sheet member 3 may be slightly smaller than the outer periphery of the seed crystal 2. Specifically, the sheet member 3 is provided so that the outer periphery is smaller than the outer periphery of the seed crystal 2, for example, in the range from 1 µm to 1 cm in the plan view.

The sheet member 3 can be provided so that the external form in the plan view has, for example, a polygonal shape or a circular shape. Further, the size of the sheet member 3 may be appropriately set, but, for example, the size can be set to be equal to or greater than the area of the lower end surface 5A of the holding member 5, and to be equal to or less than the area of the upper surface 2A of the seed crystal 2. Further, there is no problem if the size of the sheet member 3 is smaller than the area of the lower end surface 5A of the holding member 5.

The material of the sheet member 3 can be appropriately set according to the material of the bonding agent 4. When stress is applied to the bonding agent 4, the sheet member 3 may use a material that can alleviate the stress. For example, the material may be set in consideration of an elastic modulus or the like appropriate for the material of the bonding agent 4. Specifically, a sheet-shaped member obtained by compressing graphite can be used as the sheet member 3. The sheet member 3 may be provided so that the thickness thereof is, for example, from 0.1 µm to 5 mm.

According to the configuration described above, the seed crystal holder 1 is configured. Here, if the seed crystal holder 1 is used for growing the crystal by the solution method, the coefficient of thermal expansion of the bonding agent 4 is different from those of the seed crystal 2 and the holding member 5. Therefore, thermal stress is inherent in the bonding agent 4.

The seed crystal holder according to the present embodiment includes the sheet member 3 interposed in the bonding agent 4 fixing the seed crystal 2 and the holding member 5 in the thickness direction. Therefore, since the sheet member 3 is elastically deformed according to the thermal stress inherent in the bonding agent 4, it is possible to decrease the thermal stress between the bonding agent 4 and the holding member 5 or between the bonding agent 4 and the seed crystal 2. As a result, the bonding agent 4 is easily peeled off from the seed crystal 2 or the holding member 5.

Since the deformation of the seed crystal 2 in a surface direction is suppressed in this manner, it is possible to maintain the flatness of the lower surface 2B of the seed crystal 2. As a result, it is possible to suppress the generation of the dislocation or micropipe in the crystal to be grown on the lower surface 2B of the seed crystal 2.

In addition, the sheet member 3 has the outer periphery smaller than the outer periphery of the seed crystal 2 in the plan view. Therefore, for example, when a bonding material in a step before the bonding agent 4 is solidified is coated, it is possible to cause the bonding material to easily enclose the side surfaces of the sheet member 3, and the bonding material is not easily adhered to the side surfaces of the seed crystal 2. As a result, it is possible to improve the quality of the crystal to be grown on the lower surface 2B of the seed crystal 2.

Meanwhile, if the outer periphery of the sheet member is caused to be greater than that of the seed crystal, the bonding material is easily adhered to the side surfaces of the seed crystal. Therefore, when the silicon carbide crystal that causes the seed crystal to be brought into contact with the solution is grown, miscellaneous crystals are easily grown from a starting point of the bonding material adhered to the side surface of the seed crystal. As a result, the miscellaneous crystals disturb the crystal from growing so that, for example, it may not be possible to increase the size of the crystal.

(Modification 1 of Seed Crystal Holder)

When the carbon bonding agent is used as the bonding agent 4, it is possible to alleviate the thermal stress generated by the difference in the coefficients of thermal expansion of the bonding agent 4 and the sheet member 3. Therefore, the bonding agent 4 and the sheet member 3 are not easily peeled off from each other. Further, in the description below, the bonding agent 4 made with the carbon bonding agent may be simply called the carbon bonding agent 4'.

A member made of carbon may be used as the holding member 5. When the holding member 5 made of carbon is used, the carbon bonding agent 4' contains carbon. Therefore, the coefficient of thermal expansion of the holding member 5 can be close to that of the carbon bonding agent 4'. Accordingly, it is possible to cause the carbon bonding agent 4' not to be easily peeled off from the holding member 5.

Figure 3:
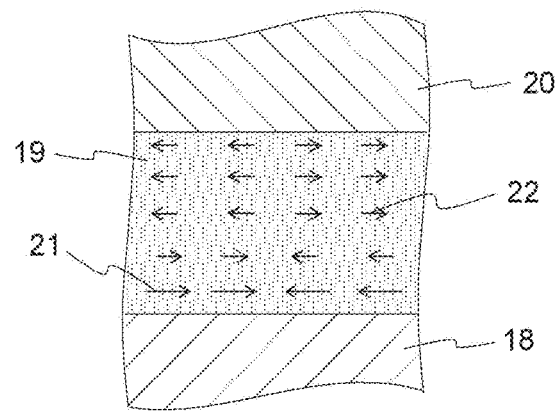
FIG. 3 is a diagram illustrating a seed crystal holder according to the related art, and is an enlarged cross-sectional view illustrating an enlarged part of the seed crystal holder.

As illustrated in FIG. 3, a seed crystal holder 17 according to the related art fixes a seed crystal 18 to a holding member 20 through a carbon bonding agent 19. Therefore, since the carbon bonding agent 19 and the seed crystal 18 are different materials, the coefficients of thermal expansion thereof are different from each other. Accordingly, a thermal stress 21 is easily generated near the border between the carbon bonding agent 19 and the seed crystal 18.

Therefore, a second thermal stress 22 caused by the thermal stress 21 generated near the seed crystal 18 is inherent in the bonding agent 19 in the thickness direction. As a result, bonding strength decreases on the border between the seed crystal 18 and the bonding agent 19, and the seed crystal 18 is easily peeled off. Therefore, it may not be possible to increase the size of the crystal to be grown on a lower surface 18B of the seed crystal 18.

Figure 4:
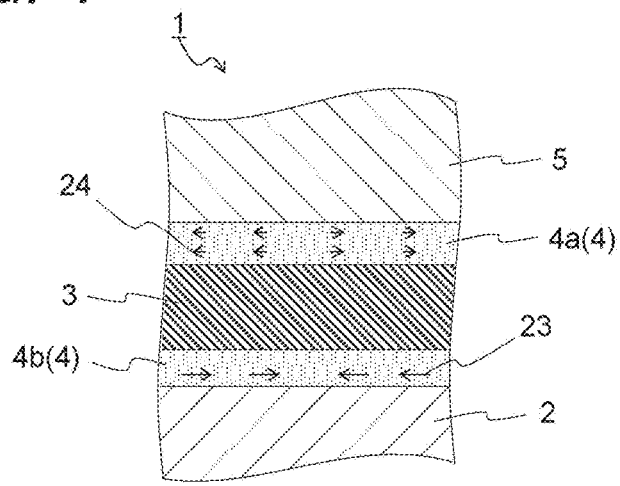
FIG. 4 is a diagram illustrating the seed crystal holder of FIG. 2, and is an enlarged cross-sectional view illustrating the enlarged seed crystal holder.

Meanwhile, as illustrated in FIG. 4, with respect to the seed crystal holder 1 according to the modification, the sheet member 3 functions as a layer that alleviates the thermal stress generated between the bonding agent 4b and the bonding agent 4a. That is, since it is possible to alleviate the thermal stress in the bonding agent 4 by elastically deforming the sheet member 3, it is possible to decrease a thermal stress 23 to be smaller than the thermal stress 21 in the seed crystal holder 17 according to the related art, and it is possible to cause the seed crystal 2 not to be easily peeled off from the bonding agent 4.

(Modification 2 of Seed Crystal Holder)

Figure 5:
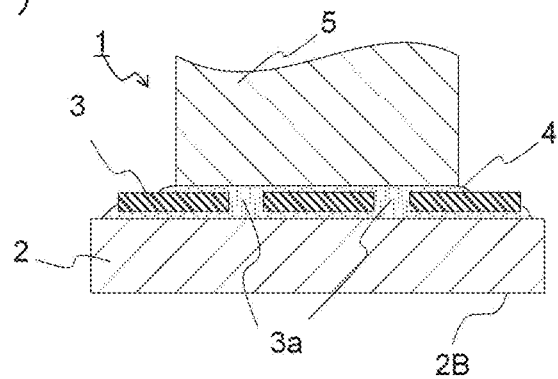
FIG. 5 is a diagram illustrating a modification of the seed crystal holder of FIG. 2.
Figure 5:
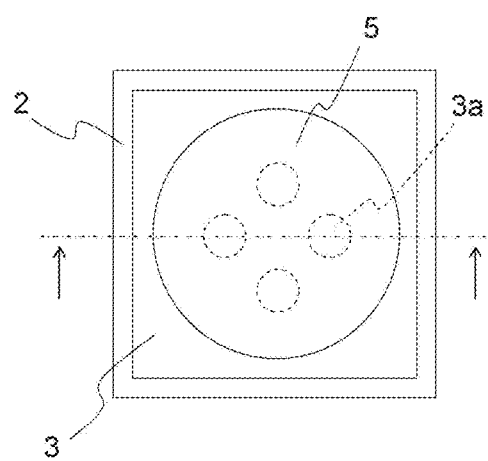
Figure 6:
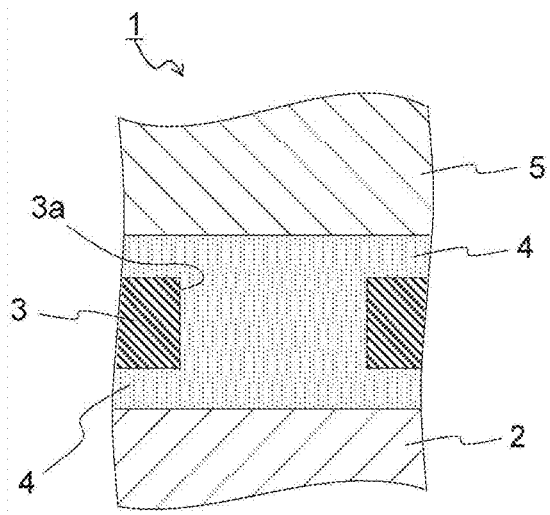
FIG. 6 is a cross-sectional view illustrating an enlarged part of the seed crystal holder of FIG. 5.

As illustrated in FIGS. 5 and 6, the sheet member 3 may include through holes 3a in the thickness direction. The through holes 3a can be set to have, for example, a polygonal shape such as a polygonal shape or a circular shape. The through holes 3a may penetrate in the thickness direction, or may be partially bent along the thickness direction. The sizes of the through holes 3a may be appropriately set according to the material of the bonding agent 4, the thickness of the sheet member 3, or the material of the holding member 5, but the sizes can be set to be, for example, from 0.5 mm to 1.5 cm. Further, the through holes 3a may be disposed to be overlapped with the holding member 5 in the plan view.

The insides of the through holes 3a are filled with the bonding agent 4. The bonding agent 4 in the through holes 3a may be disposed so that the bonding agent 4a and the bonding agent 4b are connected to each other. That is, it is not required that the insides of the through holes 3a are fully filled with the bonding agent 4.

When the crystal is grown by the solution method, as described above, it is possible to cause the crystal to be easily grown on a lower surface 2A of the seed crystal 2 by causing the temperature of the seed crystal 2 to be slightly lower than that of the solution 10.

Therefore, when the heat of the seed crystal 2 is radiated from the holding member 5, the sheet member 3 has the through holes 3a, and it is possible to cause the heat to be easily conducted by the bonding agent 4 disposed in the through holes 3a. According to this, the temperature of the seed crystal 2 is effectively decreased. As a result, the seed crystal 2 is not easily peeled off from the bonding agent 4, and it is possible to cause the crystal to be easily grown on the lower surface 2B of the seed crystal 2 by improving the thermal conduction. Further, since the bonding agent 4 easily conducts heat, it is possible to alleviate the thermal stress generated in the bonding agent 4.

According to the present modification, it is described that the sheet member 3 has the plurality of through holes 3a, but the sheet member 3 may have only one through hole 3a. When the sheet member 3 has only one through hole 3a, it is possible to adjust the thermal conduction of the bonding agent 4 by adjusting the size (diameter) and the plan view shape of the through hole 3a. Further, when the sheet member 3 has the plurality of through holes 3a, it is possible to adjust the thermal conduction of the bonding agent 4 from the seed crystal 2 to the holding member 5 by adjusting the sizes (diameters) of the through holes 3a, for example, to be small.

(Modification 3 of Seed Crystal Holding Member)

Figure 7:
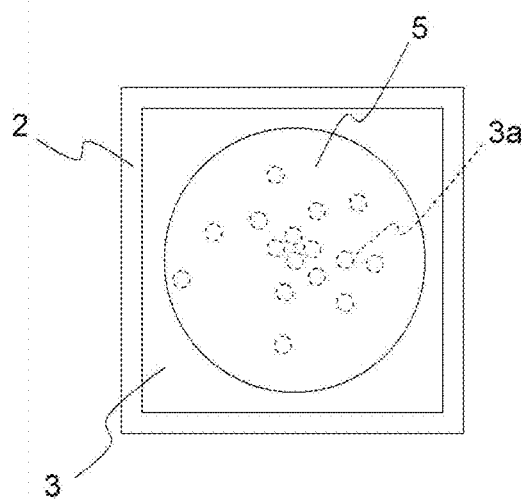
FIG. 7 is a diagram illustrating a modification of the seed crystal holder of FIG. 2, and is a plan view illustrating the modification viewed from above in a see-through manner.

The sheet member 3 has the plurality of through holes 3a, and the number of through holes 3a may increase as it goes from the outer circumference to the center of the sheet member 3. The seed crystal holder 1 of the present modification is illustrated in FIG. 7. Here, the outer circumference of the sheet member 3 refers to the outer circumference when the sheet member 3 is viewed in the planar manner, and the center refers to the center of the shape of the sheet member 3 when the sheet member 3 is viewed in the planar manner.

The number of through holes 3a may increase as it goes from the outer circumference to the center of the sheet member 3. Specifically, a straight line is drawn from the outer circumference to the center, gaps between the neighboring through holes 3a among the through holes 3a through the straight line passes may decrease as it goes from the outer circumference to the center.

In the sheet member 3, the through holes 3 disposed in this manner may be provided throughout the entire body, or only a part may be provided in this manner. According to the present modification, the description has been made with respect to the case in which the through holes 3a are disposed in this manner in a region in which the sheet member 3 is overlapped with the holding member 5 in the plan view, but the configuration is not limited to this.

In the region in which the bonding agent 4 is overlapped with the holding member 5 in the plan view, since the distance from the external air increases as it goes toward the center, the temperature of the bonding agent 4 increases as it goes toward the center. Therefore, it is possible to increase the thermal conduction near the center by disposing more through holes 3a as it goes from the outer circumference to the center as described in the present modification. As a result, it is possible to suppress the generation of the thermal stress near the center of the bonding agent 4, and the seed crystal 2 is not easily peeled off from the bonding agent 4.

(Modification 4 of Seed Crystal Holder)

Figure 8:
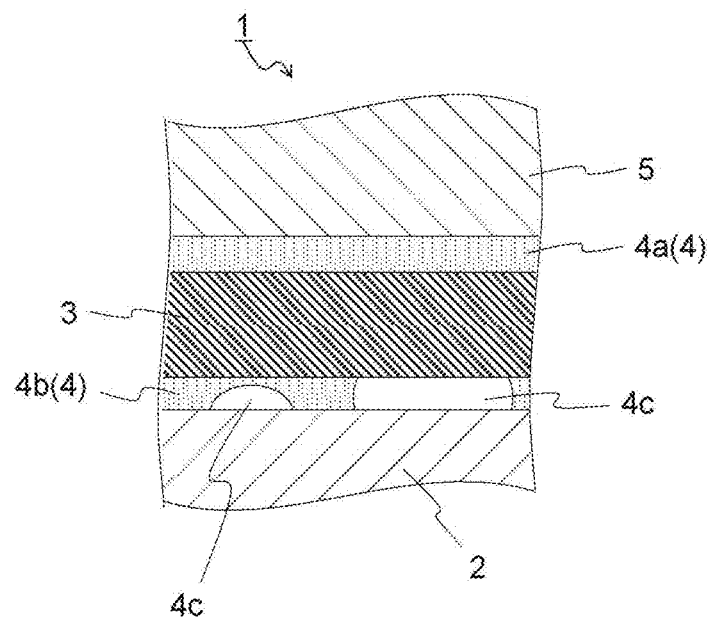
FIG. 8 is a diagram illustrating a modification of the seed crystal holder of FIG. 2, and is a cross-sectional view illustrating an enlarged part of the modification.

The bonding agent 4 may have cavities 4c between the bonding agent 4 and the seed crystal 2 as illustrated in FIG. 8. Depending on size, the cavities 4c may be disposed between the sheet member 3 and the seed crystal 2. The cavities 4c may be set so that the width is, for example, from 1 μm to 2 mm.

Since the materials of the seed crystal 2 and the bonding agent 4 are different from each other, the thermal stress is easily generated therebetween. Therefore, it is possible to alleviate the thermal stress by providing the cavities 4c constituted with the seed crystal 2. As a result, since it is possible to decrease the stress applied to the upper surface 2A of the seed crystal 2, it is possible to suppress the deformation of the crystal grown on the lower surface 2B of the seed crystal 2.

Figure 9:
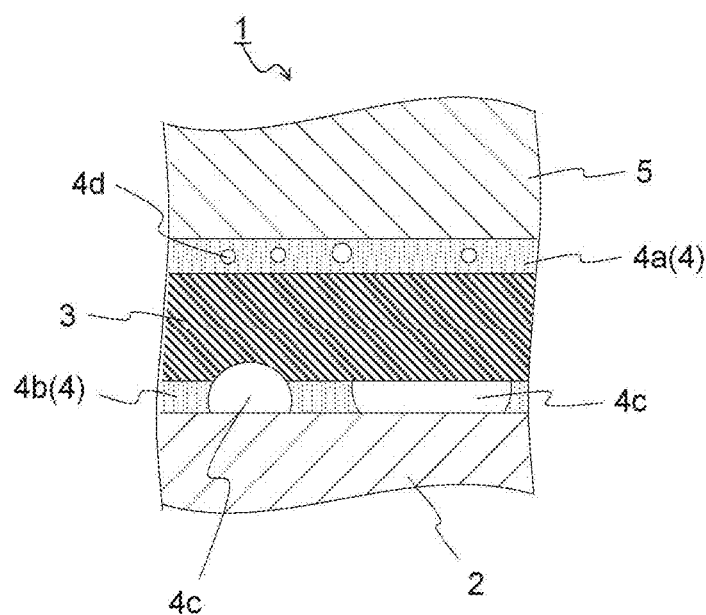
FIG. 9 is a diagram illustrating a modification of the seed crystal holder of FIG. 2, and is a cross-sectional view illustrating an enlarged part of the modification.

Further, the bonding agent 4 has pores 4d inside as illustrated in FIG. 9, and the cavities 4c are larger than the pores 4d present between the sheet member 3 and the holding member 5. That is, the cavities 4c are larger than the pores 4d present in the bonding agent 4a. Since the pores 4d are provided in the bonding agent 4, it is possible, for example, to decrease internal stress. Further, since the cavities 4c are larger than the pores 4d present in the bonding agent 4a, it is possible to maintain the bonding stress between the holding member 5 and the bonding agent 4d, and decrease the thermal stress applied on the upper surface 2A of the seed crystal 2. Further, some of the cavities 4c may exist in the sheet member 3 as illustrated in FIG. 9.

(Modification 5 of Seed Crystal Holder)

Figure 10:
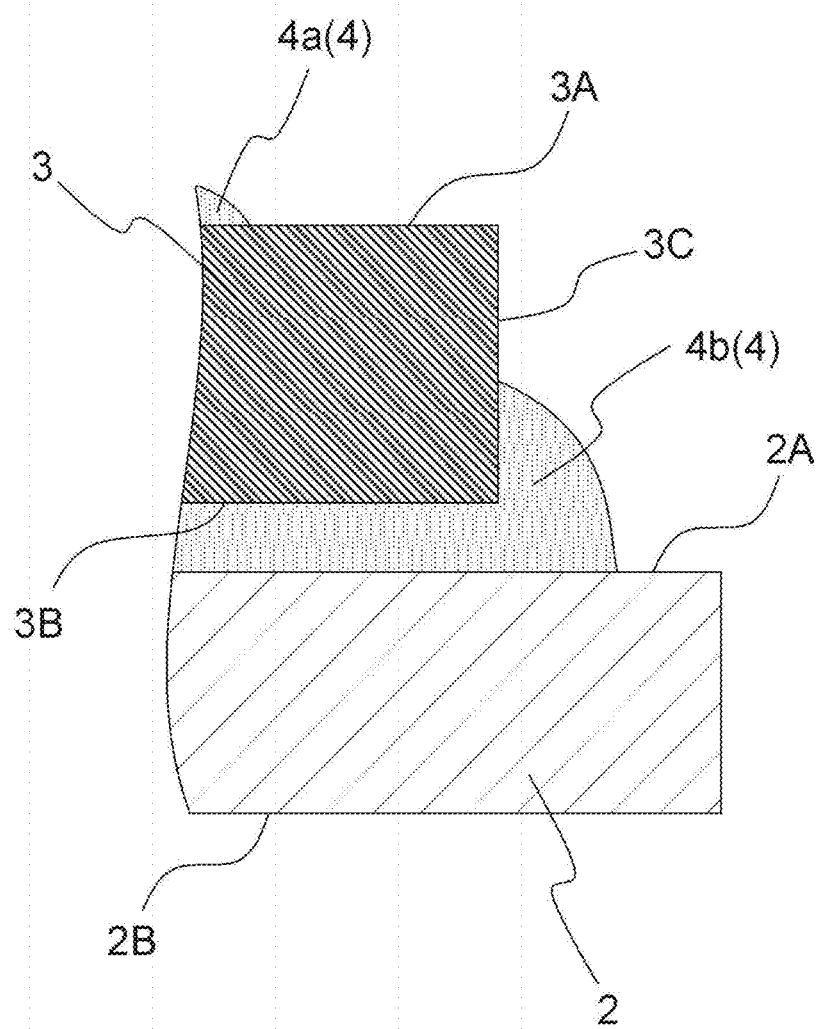
FIG. 10 is a diagram illustrating a modification of the seed crystal holder of FIG. 2, and is a cross-sectional view illustrating an enlarged part of the modification.

The bonding agent 4 may be disposed so that a part thereof covers a side surface 3C of the sheet member 3 as illustrated in FIG. 10. Specifically, the bonding agent 4b is disposed so that a part of the bonding agent 4b covers the side surface 3C of the sheet member 3. A part of the bonding agent 4b may cover only a part of the side surface 3C of the sheet member 3, or may cover the entire side surface 3C. When the bonding agent 4b is disposed so that a part of the bonding agent 4b covers the side surface 3C of the sheet member 3 in this manner, it is possible to fix a lower surface 3B of the sheet member 3 to the bonding agent 4 in the different surface direction. Therefore, it is possible to cause the bonding agent 4 not to be easily peeled off from the sheet member 3.

Figure 11:
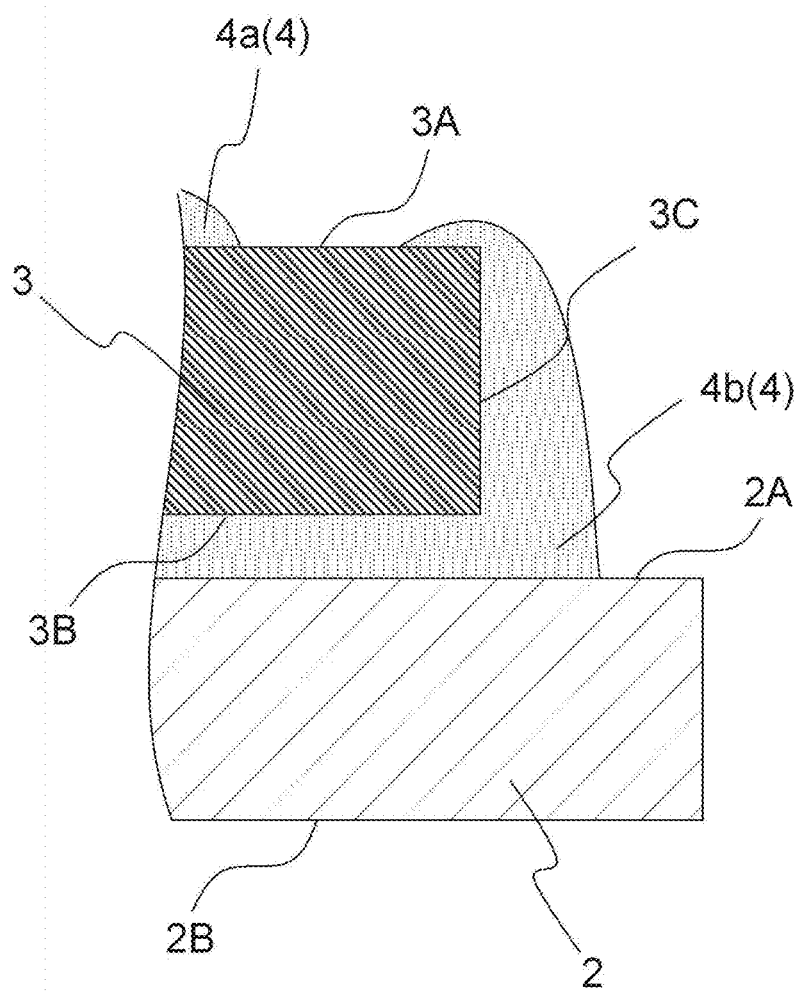
FIG. 11 is a diagram illustrating a modification of the seed crystal holder of FIG. 2, and is a cross-sectional view illustrating an enlarged part of the modification.

Further, the bonding agent 4 may be provided to cover the side surface 3C of the sheet member 3 and extend to an upper surface 3A as illustrated in FIG. 11. It is possible to further cause the bonding agent 4 not to be easily peeled off from the sheet member 3 by providing the bonding agent 4 so as to extend to the upper surface 3A of the sheet member 3 in this manner.

(Modification 6 of Seed Crystal Holder)

The sheet member 3 may include carbon particles and silicon as a component. Since the sheet member 3 includes silicon as a component, the thermal conductivity (149 [W·m$^{-1}$·K$^{-1}$]) of silicon is higher than the thermal conductivity (5 [W·m$^{-1}$·K$^{-1}$]) of carbon which is the component configuring the sheet member 3 in the thickness direction. Therefore, it is possible to improve the thermal conductivity of the sheet member 3. According to this, it is possible to improve the thermal conduction of the bonding agent 4.

Further, the component of silicon in the sheet member 3 may include the state of silicon carbide. Since the thermal conductivity of the silicon carbide is from 150 [W·m$^{-1}$·K$^{-1}$] to 350 [W·m$^{-1}$·K$^{-1}$], it is possible to further improve the thermal conduction of the bonding agent 4.

Further, it is possible to further improve the thermal conduction of the bonding agent 4 by combining the configuration of the present Modification 5 with Modification 2 and Modification 3.

Further, silicon may be included as a component in the bonding agent 4. It is possible to improve the thermal conductivity of the bonding agent 4 by causing silicon to be included as a component in the bonding agent 4 in this manner. According to this, it is possible to improve the thermal conduction of the bonding agent 4.

Figure 12:
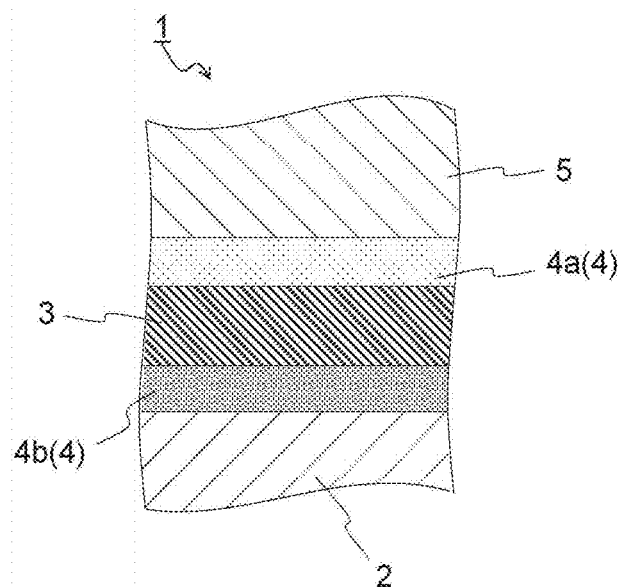
FIG. 12 is a diagram illustrating a modification of the seed crystal holder of FIG. 2, and is a cross-sectional view illustrating an enlarged part of the modification.

Further, with respect to the amount of the silicon component included in the bonding agent 4, as illustrated in FIG. 12, the amount in the bonding agent 4a between the sheet member 3 and the holding member 5 may be different from that in the bonding agent 4b between the sheet member 3 and the seed crystal 2.

Specifically, the bonding agent 4 may be set so that the amount of the silicon component in the bonding agent 4b is greater than that in the bonding agent 4a. In this manner, it is possible to decrease the difference of the bonding agent 4b in the coefficient of thermal expansion from the seed crystal 2 made of silicon carbide and to suppress the difference of the bonding agent 4a from the holding member 5 made of carbon in the coefficient of thermal expansion from increasing by causing the amount of silicon included in the bonding agent 4b to be greater than that in the bonding agent 4a. According to this, it is possible to cause the seed crystal 2 not to be easily peeled off from the bonding agent 4b, and to cause the holding member 5 not to be easily peeled off from the bonding agent 4a.

When the carbon bonding agent 4' is used as the bonding agent 4, it is possible to cause the aforementioned silicon to be included in the carbon bonding agent 4' in a state of silicon carbide and to further decrease the difference of the carbon bonding agent 4' from the seed crystal 2 in the coefficient of thermal expansion by causing silicon to be included in the carbon bonding agent 4' as a component. Further, it is possible to favorably fix the holding member 5 to the seed crystal 2 by causing the amount of the silicon as a component included in the carbon bonding agent 4'a to be less than that in the carbon bonding agent 4'b.

(Modification 7 of Seed Crystal Holder)

Figure 13:
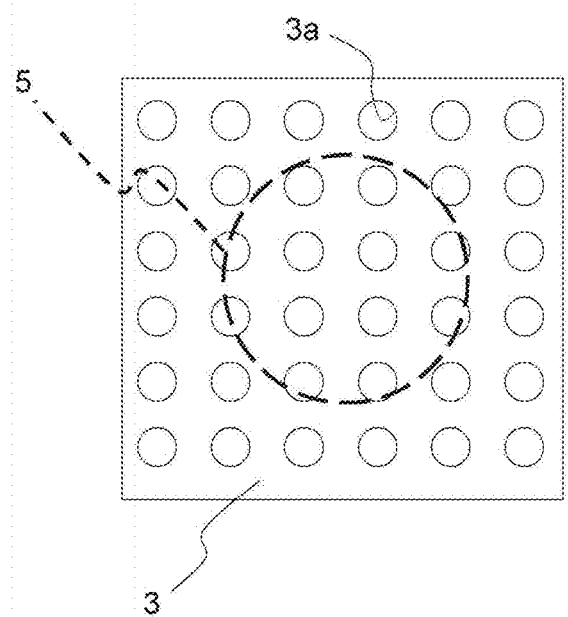
FIG. 13 is a diagram illustrating a sheet member used in the modification of the seed crystal holder of FIG. 2, and is a plan view illustrating the sheet member viewed from above in a plan view.

As illustrated in FIG. 13, the plurality of through holes 3a may be included throughout the entire sheet member 3, and some of the plurality of through holes 3a may be disposed in the region not overlapped with the holding member 5 in the plan view.

Figure 14:
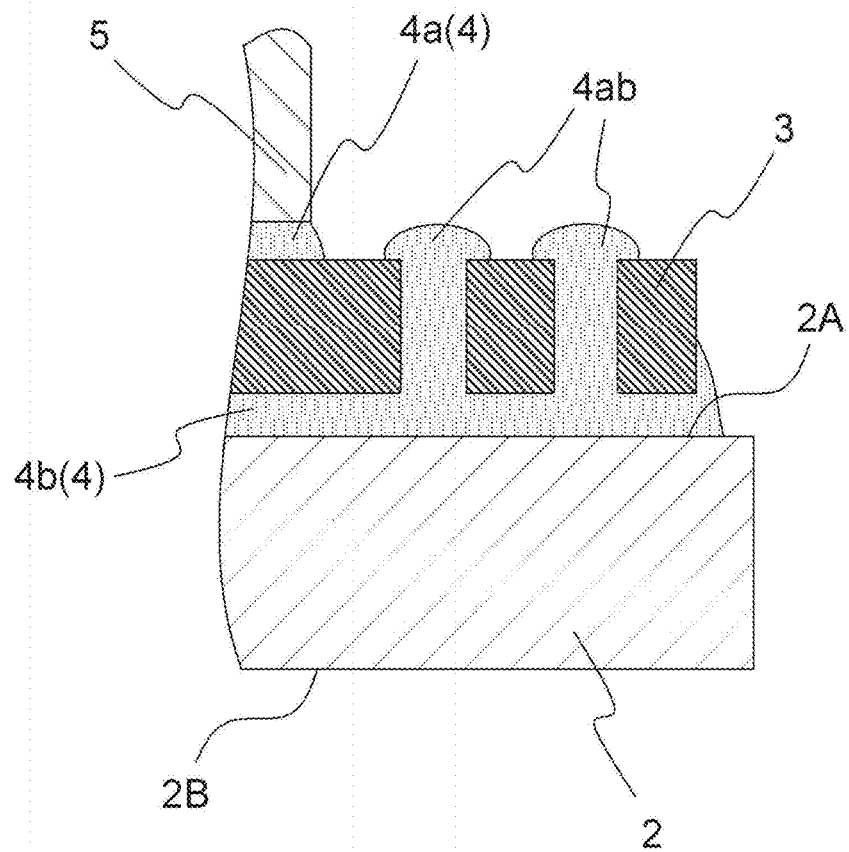
FIG. 14 is a diagram illustrating a modification of the seed crystal holder of FIG. 2, and is a cross-sectional view illustrating an enlarged part of a seed crystal holding member formed by using the sheet member illustrated in FIG. 11.

Since the sheet member 3 has the through holes 3a in a region not overlapped with the holding member 5, it is possible to cause a part of the bonding agent 4b to extend to the upper surface 3A of the sheet member 3 as illustrated in FIG. 14. Since the seed crystal holder 1 having bonding parts 4ab extending to the upper surface 3A of the sheet member 3 may be fixed by the bonding parts 4ab, it is possible to cause the bonding agent 4 not to be easily peeled off from the sheet member 3.

The seed crystal holder 1 using the sheet member 3 having the bonding parts 4ab in this manner may be manufactured as follows. When the sheet member 3 is configured as illustrated in FIG. 13, the bonding agent 4b is coated on the upper surface 2A of the seed crystal 2, the sheet member 3 is mounted on the bonding agent 4b, the bonding agent 4a is then coated on a part of the upper surface 3A of the sheet member 3, and the holding member 5 is placed thereon.

Subsequently, while the holding member 5 is pressed to the sheet member 3, the bonding agent 4 is heated so that the seed crystal 2 and the holding member 5 are fixed. When the holding member 5 is pressed in this manner, it is possible to form the bonding parts 4ab in which the bonding agent 4b passes through the through holes 3a of the sheet member 3 in a region not overlapped with the holding member 5 in the plan view and goes around to the upper surface 3A of the sheet member 3.

Figure 15:
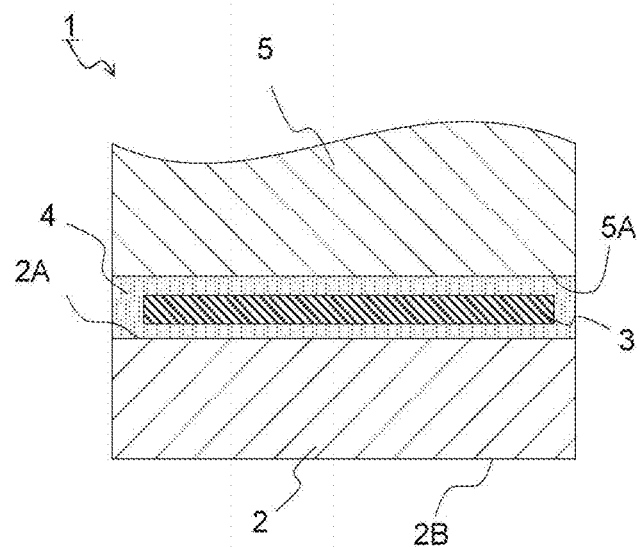
FIG. 15 is a diagram illustrating a modification of the seed crystal holder of FIG. 2, and is a cross-sectional view illustrating an enlarged part of the modification.

In the above description, it is described that the holding member 5 is smaller than the seed crystal 2, but the holding member 5 may be larger than the seed crystal 2 as illustrated in FIG. 15. In this case, the sheet member 3 is smaller than the external forms of the seed crystal 2 and the holding member 5 in the plan view. Even in this case, since it is possible to alleviate the stress in the bonding agent 4 by the sheet member 3, it is possible to suppress the seed crystal 2 from being peeled off from the bonding agent 4.

<Seed Crystal Growing Method>

Next, the crystal growing method according to the present invention is described. The crystal growing method according to the present invention has a first preparation step, a second preparation step, and a growing step.

(First Preparation Step and Second Preparation Step)

In the first preparation step, the melting crucible 7 and the silicon solution 10 including carbon kept in the melting crucible 7 are prepared. Subsequently, in the second preparation step, the aforementioned seed crystal holder 1 is prepared.

(Growing Step)

Next, in the crystal growing device 6 as illustrated in FIG. 1, the lower surface 2B of the seed crystal 2 is brought into contact with the silicon solution 10 including carbonization in the melting crucible 7. The contact of the seed crystal 2 with the solution 10 may be achieved by bringing a part of the lower surface 2B into contact with the solution 10. Further, the seed crystal 2 may be introduced in the solution 10, for example, to a degree in which the upper surface 2A of the seed crystal 2 is immersed in the solution 10.

Thereafter, it is possible to grow the silicon carbide crystal from the solution 10 on the lower surface 2B of the seed crystal 2 by raising the holding member 5 upwardly (direction D2). The raising speed of the holding member 5 may be set, for example, according to the growing speed of the crystal grown on the lower surface 2B of the seed crystal 2.

In the crystal growing method according to the present embodiment, since the crystal is grown on the lower surface 2B of the seed crystal 2 by using the seed crystal holder 1, even if the crystal grown on the lower surface 2B becomes large, the seed crystal 2 is caused not to be easily peeled off from the lower end surface 5A of the holding member 5. As a result, it is possible to improve the productivity of the crystal to be grown.

(Modification of Crystal Growing Method)

A step of immersing a part of the bonding agent 4 together with the seed crystal 2 in the solution 10 kept in the melting crucible 7 may be included between the second preparation step and the growing step. Since it is possible to include silicon as a component in the part of the bonding agent 4 by immersing the part of the bonding agent 4 together with the seed crystal 2 in the solution 10, it is possible to improve the thermal conductivity of the bonding agent 4.

In this manner, it is possible to cause the seed crystal 2 not to be easily peeled off from the bonding agent 4. Therefore, even if the silicon carbide crystal is grown to be large on the lower surface 2B of the seed crystal 2, it is possible to cause the seed crystal 2 not to be easily peeled off from the bonding agent 4, and to cause the crystal to be grown to be large.

In addition, the seed crystal 2, a part of the bonding agent 4, and the sheet member 3 may be immersed in the solution 10. In this case, since it is possible to cause the silicon as the component to be included in the sheet member 3, it is possible to improve the thermal conductivity of the bonding agent 4 and to improve the thermal conductivity of the sheet member 3.

If the solution 10 has temperature distribution in the depth direction, when the bonding agent 4 is immersed in the solution 10, the seed crystal 2 may be immersed to the position in which the temperature is high. For example, the solution 10 is set to have the temperature distribution in the depth direction, for example, by performing setting so that the temperature increases as it goes deeper from a solution surface. Here, for example, with respect to the temperature of the solution surface, it is possible to set the temperature distribution to be in the range of equal to or lower than 50° C.

In this case, it is possible to immerse the seed crystal 2 to come close to the vicinity of the base of the melting crucible 7. It is possible to dissolve miscellaneous crystals grown on the lower surface 2B of the seed crystal 2 by disposing the seed crystal 2 at a position of the high temperature. According to this, it is possible to further suppress the miscellaneous crystals from growing on the seed crystal 2.

Further, when the seed crystal 2 is disposed at the position of the high temperature, the crystal grown on the lower surface 2B of the seed crystal 2 may be caused to be in contact with the base of the melting crucible 7. According to this, it is possible to surely dissolve the miscellaneous crystals and also to easily peel off the miscellaneous crystals physically.

The invention claimed is:

1. A seed crystal holder for growing a crystal by a solution method, comprising:
   a seed crystal made of silicon carbide;
   a sheet member made of carbon and having an outer periphery;
   a first bonding agent configured to fix the sheet member to the seed crystal and having an outer periphery;
   a holding member above the sheet member; and
   a second bonding agent configured to fix the sheet member to the holding member and having an outer periphery,
   wherein in a plan view the outer periphery of the first bonding agent is located outside the outer periphery of the second bonding agent and the outer periphery of the second bonding agent is smaller than the outer periphery of the sheet member, and
   the seed crystal, the first bonding agent, the sheet member, the second bonding agent, and the holding member have respective diameters, and the diameter of the seed crystal is larger than the diameter of the first bonding agent, which is larger in diameter than the sheet member, which is larger in diameter than the second bonding agent, which is larger in diameter than holder.

2. The seed crystal holder according to claim 1, wherein the outer periphery of the sheet member is larger than an outer periphery of the holding member in a plan view.

3. The seed crystal holder according to claim 1, wherein the bonding agent comprises a cavity constituted with the seed crystal.

4. The seed crystal holder according to claim 3, wherein the bonding agent further comprises a pore thereinside, and the cavity is larger than the pore, the pore being located between the sheet member and the holding member.

5. The seed crystal holder according to claim 1, wherein the sheet member comprises a through hole in the thickness direction, and an inside of the through hole is filled with a part of the bonding agent.

6. The seed crystal holder according to claim 5, wherein the sheet member further comprises a plurality of through holes, and the number of the plurality of through holes increases as going to a center of the sheet member from an outer circumference.

7. The seed crystal holder according to claim 1, wherein a part of the first bonding agent covers a side surface of the sheet member.

8. The seed crystal holder according to claim 1, wherein the sheet member includes carbon particles and silicon as a component.

9. The seed crystal holder according to claim 1, wherein the sheet member includes silicon in a state of silicon carbide.

10. The seed crystal holder according to claim 1, wherein the first and second bonding agents include-silicon as a component.

11. The seed crystal holder according to claim 10, wherein the silicon included in the second bonding agent is more than the silicon included in the first bonding agent.

* * * * *